United States Patent
Chu et al.

(10) Patent No.: US 11,735,550 B2
(45) Date of Patent: Aug. 22, 2023

(54) BUMP STRUCTURE TO PREVENT METAL REDEPOSIT AND TO PREVENT BOND PAD CONSUMPTION AND CORROSION

(71) Applicant: Taiwan Semiconductor Manufacturing Company, Ltd., Hsin-Chu (TW)

(72) Inventors: Ching-Sheng Chu, Baoshan Township (TW); Chern-Yow Hsu, Chu-Bei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/555,854

(22) Filed: Dec. 20, 2021

(65) Prior Publication Data

US 2022/0115349 A1    Apr. 14, 2022

Related U.S. Application Data

(63) Continuation of application No. 16/589,377, filed on Oct. 1, 2019, now Pat. No. 11,211,352.

(51) Int. Cl.
*H01L 23/00* (2006.01)
*H01L 23/522* (2006.01)
(Continued)

(52) U.S. Cl.
CPC ........ *H01L 24/16* (2013.01); *H01L 21/76834* (2013.01); *H01L 23/5226* (2013.01);
(Continued)

(58) Field of Classification Search
CPC .............. H01L 24/16; H01L 21/76834; H01L 23/5226; H01L 23/5283; H01L 24/08; H01L 24/11; H01L 2924/01007; H01L 2924/01013; H01L 2924/01028; H01L 2924/01029; H01L 2924/01079; H01L 2924/37001; H01L 24/03; H01L 24/05; H01L 24/13; H01L 2224/034; H01L 2224/03622; H01L 2224/05022; H01L 2224/05027; H01L 2224/05186;
(Continued)

(56) References Cited

U.S. PATENT DOCUMENTS

| | | | |
|---|---|---|---|
| 2005/0233571 A1* | 10/2005 | Tao | H01L 24/13 257/E23.021 |
| 2018/0151527 A1* | 5/2018 | Chang | H01L 24/11 |
| 2018/0233474 A1 | 8/2018 | Yu et al. | |

OTHER PUBLICATIONS

Non-Final Office Action dated Apr. 30, 2021 for U.S. Appl. No. 16/589,377.
(Continued)

*Primary Examiner* — Karen Kusumakar
*Assistant Examiner* — Adam S Bowen
(74) *Attorney, Agent, or Firm* — Eschweiler & Potashnik, LLC

(57) ABSTRACT

Various embodiments of the present disclosure are directed towards a semiconductor structure including a bond bump disposed on an upper surface of an upper conductive structure. The upper conductive structure overlies a substrate. A buffer layer is disposed along the upper surface of the upper conductive structure. The bond bump comprises a sidewall having a straight sidewall segment overlying a curved sidewall segment.

20 Claims, 11 Drawing Sheets

(51) Int. Cl.
*H01L 23/528* (2006.01)
*H01L 21/768* (2006.01)

(52) U.S. Cl.
CPC .......... *H01L 23/5283* (2013.01); *H01L 24/08* (2013.01); *H01L 24/11* (2013.01); *H01L 2924/01007* (2013.01); *H01L 2924/01013* (2013.01); *H01L 2924/01028* (2013.01); *H01L 2924/01029* (2013.01); *H01L 2924/01079* (2013.01); *H01L 2924/37001* (2013.01)

(58) Field of Classification Search
CPC . H01L 2224/05571; H01L 2224/05572; H01L 2224/05624; H01L 2224/05647; H01L 2224/05686; H01L 2224/13082; H01L 23/3192; H01L 2224/02163; H01L 2224/0221; H01L 2224/02215; H01L 2224/03019; H01L 2224/0401; H01L 2224/05554; H01L 2224/11019; H01L 2224/114; H01L 2224/11472; H01L 2224/119; H01L 2224/13014; H01L 2224/13016; H01L 2224/13018; H01L 2224/13022; H01L 2224/131; H01L 2224/13144; H01L 2224/13155; H01L 23/488; H01L 21/4814; H01L 27/092; H01L 2224/1161; H01L 2224/13005; H01L 2224/1302
See application file for complete search history.

(56) References Cited

OTHER PUBLICATIONS

Notice of Allowance dated Aug. 20, 2021 for U.S. Appl. No. 16/589,377.

* cited by examiner

BUMP STRUCTURE TO PREVENT METAL REDEPOSIT AND TO PREVENT BOND PAD CONSUMPTION AND CORROSION

REFERENCE TO RELATED APPLICATION

This Application is a Continuation of U.S. application Ser. No. 16/589,377, filed on Oct. 1, 2019, the contents of which are hereby incorporated by reference in their entirety.

BACKGROUND

Semiconductor chips are used in all kinds of electronic and other devices and are well-known. Today's wide-spread use of such chips, and consumer demands for more powerful and more compact devices dictates that chip manufacturers continuously decrease the physical size and continuously increase the functionality of such chips. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
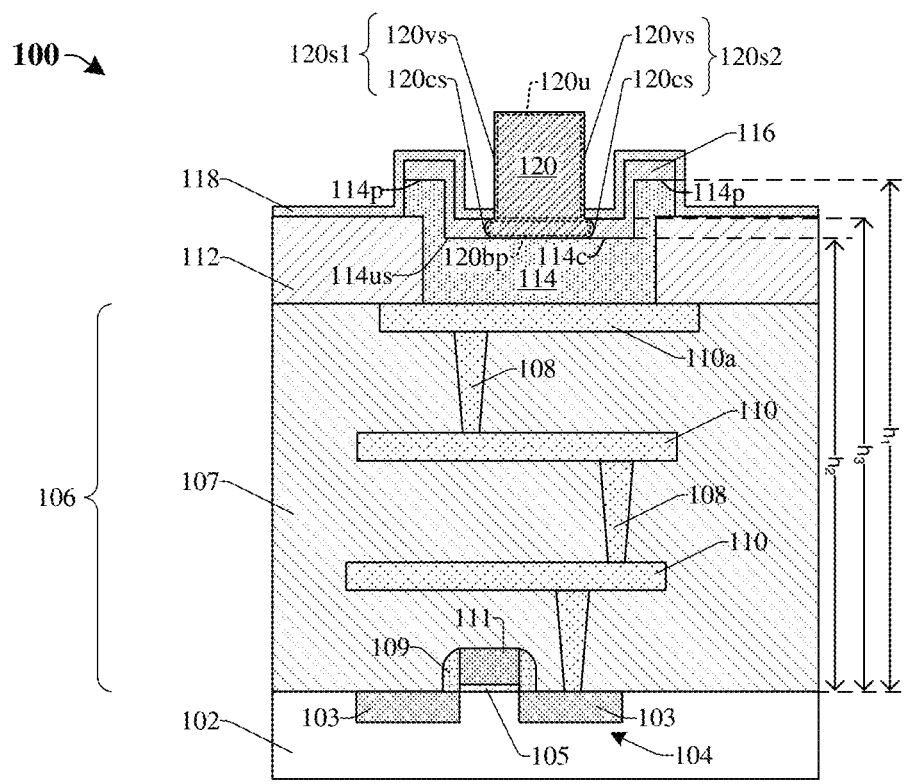
FIG. 1 illustrates a cross-sectional view of some embodiments of a complementary metal-oxide semiconductor (CMOS) chip having a bump structure overlying a bond pad, where the bond pad overlies an interconnect structure that is electrically coupled to a semiconductor device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Typical complementary metal-oxide semiconductor (CMOS) dies include an interconnect structure overlying a substrate. One or more semiconductor devices (e.g., transistor(s), varactor(s), resistor(s), capacitor(s)) are arranged in, on, or over the substrate and are electrically coupled to one or more bond pads by way of the interconnect structure. Bump structures directly overlie each bond pad and are configured to facilitate electrical coupling to a printed circuit board (PCB) or another CMOS die by, for example, a metallic bonding process.

A method for forming a bump structure includes forming a bond pad directly over a topmost conductive layer in the interconnect structure. An etch stop layer is formed over the bond pad, and an oxide layer is formed over the etch stop layer. A first etch (e.g., a plasma etch) is performed according to a masking layer to remove a portion of the etch stop layer and a portion of the oxide layer, thereby defining a bump structure opening that exposes an upper surface of the bond pad. To ensure the first etch clears the etch stop layer from the upper surface of the bond pad, the first etch etches slightly into the bond pad. Unfortunately, as appreciated in some aspects of the present disclosure, when this bond pad material (e.g., aluminum) is removed by the first etch, the bond pad material and/or by-products thereof can re-deposit onto sidewalls of the etch stop layer and sidewalls of the oxide layer in the bump structure opening. Further, in some instances, this first etch can include fluorine free radicals. When the fluorine free radicals come into contact with the material of the bond pad, the fluorine and bond pad material can react to form by-products on the upper surface of the bond pad. These by-products can subsequently react with moisture in the ambient environment to yield hydrofluoric acid (HF), which will corrode the upper surface of the bond pad, leaving the upper surface of the bond pad damaged and rough. An argon bombardment process may be performed to remove this corrosion, but this adds time and cost to the manufacturing process.

A bump structure, such as a solder bump for example, is then formed on the upper surface of the bond pad. After forming the bump structure, the remaining oxide layer is removed by a second etch (e.g., a vapor etch comprising etchants such as hydrofluoric acid). During the second etch, the re-deposited materials (e.g., aluminum) on the sidewalls of the bump structure may fall or peel off of the bump structure onto adjacent structures. Since the re-deposited materials are conductive, the materials may electrically short adjacent conductive structures and/or adjacent bump structures together, thereby rendering devices on the CMOS die inoperable. Further, if left in place, the damaged/rough upper surface of the bond pad can also lead to long-term reliability concerns, for example due to adhesion concerns and/or increased electrical resistance between the solder bump and bond pad.

In some embodiments of the present disclosure, to eliminate the re-disposition of materials from the bond pad onto sidewalls of the bump structure and to provide a good interface between the bond pad and solder bump, a buffer layer may be formed over the bond pad prior to formation of an etch stop layer. Thus, after the buffer layer is formed, an etch stop layer can be formed over the buffer layer, and an oxide layer can be formed over the etch stop layer. A first etch (e.g., a plasma etch containing fluorine free radicals) is performed to remove a portion of the oxide layer and the etch stop layer, thereby defining a bump structure opening that exposes an upper surface of the buffer layer. Because the first etch stops on the buffer layer, the first etch does not come into contact with the bond pad and will not lead to re-deposition of the bond pad material onto sidewalls of the bump structure opening. A second etch (e.g., a wet etch) is then performed to extend the bump structure opening by removing the exposed portion of the buffer layer to expose an upper surface of the bond pad. Because this second etch is a wet etch, it may undercut the etch stop layer and leaves the extended bump structure opening with clean sidewalls (i.e., re-deposited material from the bond pad is not present along sidewalls of the bump structure opening). Additionally, by virtue of the wet etch process, the upper bond pad surface is smooth and provides a good contact interface for a bump structure. Thus, when a bump structure is subsequently formed over the bond pad and a third etch process (e.g., comprising etchants such as hydrofluoric acid) is performed to remove the remaining oxide layer, the result is a good physical and electrical contact between the bond pad and the bump structure.

Referring to FIG. 1, a cross-sectional view of some embodiments of a complementary metal-oxide semiconductor (CMOS) chip 100 with a bump structure 120 overlying a bond pad 114 is provided.

The CMOS chip 100 includes a substrate 102, an interconnect structure 106, and a bump structure 120 electrically coupled to the interconnect structure 106 by the bond pad 114. A semiconductor device 104 is disposed over the substrate 102. The semiconductor device 104 may, for example, be a transistor. In the aforementioned example, the semiconductor device 104 may comprise: source/drain regions 103 disposed in the substrate 102, a gate dielectric 105 disposed between the source/drain regions 103, a gate electrode 111 overlying the gate dielectric 105, and a sidewall spacer 109 disposed around sidewalls of the gate electrode 111 and the gate dielectric 105. The semiconductor device 104 is electrically coupled to overlying metal layers, overlying electronic devices (e.g., memory cells, metal-insulator-metal capacitors, resistors, etc.), and/or another CMOS die by way of the interconnect structure 106.

The interconnect structure 106 includes a plurality of conductive vias 108, a plurality of conductive wires 110, and an interconnect dielectric structure 107. The conductive vias 108 and the conductive wires 110 are disposed within the interconnect dielectric structure 107 and are configured to electrically couple the semiconductor device 104 to overlying conductive structures. A topmost conductive wire 110a directly underlies the bond pad 114.

A passivation structure 112 overlies the interconnect structure 106. The bond pad 114 extends from a top surface of the passivation structure 112 to the topmost conductive wire 110a. A buffer layer 116 overlies an upper surface 114us of the bond pad 114. An etch stop layer 118 continuously extends over the passivation structure 112, the bond pad 114, and the buffer layer 116. A bump structure 120 directly overlies the bond pad 114. The bump structure 120 is configured to electrically couple the bond pad 114 to another CMOS die (not shown). In some embodiments, the upper surface 114us of the bond pad 114 includes a peripheral region 114p and a central region 114c; and an upper portion of the bond pad's peripheral region 114p overhangs the passivation structure 112. The upper surface of the peripheral region 114p has a first height, $h_1$, as measured from an upper surface of the substrate 102, and the upper surface of the central region 114c has a second height, $h_2$, as measured from the upper surface of the substrate 102. The first height $h_1$ is greater than the second height $h_2$.

The bump structure 120 comprises a base portion 120bp in direct contact with the upper surface 114us of the bond pad 114, and an upper portion 120u extending upwardly through the etch step layer 118. In some cases the base portion 120bp of the bump structure 120 meets the upper portion 120u of the bump structure 120 at a third height, $h_3$, that is less than the first height $h_1$ and greater than the second height $h_2$. The base portion 120bp is defined between curved outer sidewalls 120cs; and the upper portion 120u is defined between vertical outer sidewalls 120vs. The curved sidewall 120cs is disposed within the buffer layer 116. The vertical sidewall 120vs extends from a top surface of the buffer layer 116 to a point corresponding to a top surface of the bump structure 120. In some embodiments, opposing sidewalls 120s1, 120s2 of the bump structure 120 are defined from a cross-sectional view. For example, if when viewed from above the bump structure 120 is circular/elliptical then the opposing sidewalls 120s1, 120s2 are a single continuous sidewall when viewed from above, therefore the opposing "sidewalls" 120s1, 120s2 refers to the nature of this single continuous sidewall when depicted in in a cross-sectional view. Additionally, if when viewed from above the bump structure 120 is circular or elliptical then any length and/or width associated with a cross-sectional view of the structure (s) and/or layer(s) comprising the bump structure 120 respectively correspond to diameters of a circle or lengths defined between two vertices on the major axis of an ellipse.

By disposing the curved sidewalls 120cs in the buffer layer 116, the re-deposition of conductive materials from the bond pad 114 to the opposing sidewalls 120s1, 120s2 of the bump structure 120 is mitigated during fabrication of the CMOS chip 100. By mitigating the re-deposition of conductive materials from the bond pad 114, the bump structure 120 is electrically isolated from adjacent conductive structures, and thus yields for the CMOS chip 100 are improved. Further, by disposing the buffer layer 116 between the etch stop layer 118 and the bond pad 114 a number of processing steps utilized to fabricate the CMOS chip 100 is reduced and/or eliminated. This, in part, decreases yield loss, time, and costs associated with fabricating the CMOS chip 100.

Figure 2:
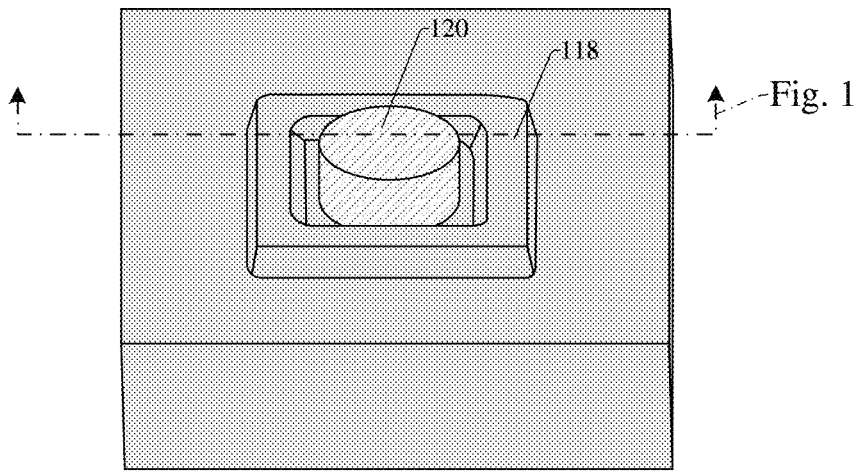
FIG. 2 illustrates a perspective view of some embodiments of a bump structure overlying a bond pad.

Referring to FIG. 2, a perspective view 200 of some embodiments of the bump structure 120 of FIG. 1 is provided. As seen in FIG. 2, the bump structure 120 has a cylindrical shape. Thus, the base portion (FIG. 1: 120bp) of the bump structure 120 and the upper portion (FIG. 1: 120u) of the bump structure 120 are both cylindrical with the base portion (FIG. 1: 120bp) having a width or diameter that is greater than that of the upper portion (FIG. 1: 120u). Although not viewable in FIG. 2, the bond pad (FIG. 1: 114) has a rectangular/square shape, such that the bump structure 120 is arranged between inner sidewalls of the bond pad (FIG. 1: 114). A top surface of the bump structure 120 is vertically above a top surface of the bond pad (FIG. 1: 114).

Figure 3:
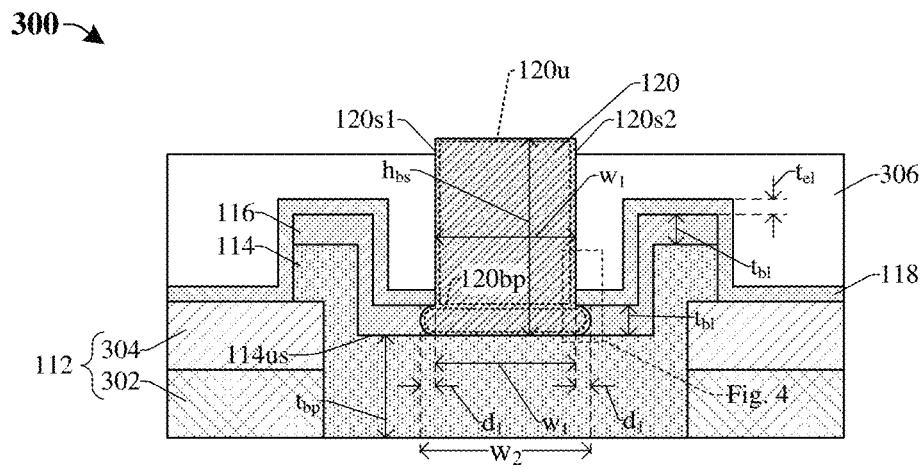
FIG. 3 illustrates a cross-sectional view of some alternative embodiments of the bump structure of FIG. 1.

Referring to FIG. 3, a cross-sectional view 300 of some embodiments of the bump structure 120 of FIG. 1 is provided.

A dielectric structure 306 is disposed over the etch stop layer 118 and the bump structure 120. In some embodiments, the dielectric structure 306 may, for example, be or comprise an oxide such as silicon dioxide, gold oxide, another suitable oxide, or the like. In further embodiments, the dielectric structure 306 is omitted. A lower portion of the bond pad 114 is disposed within the passivation structure 112. The passivation structure 112 includes an upper dielectric layer 304, and a lower dielectric layer 302. The upper dielectric layer 304 may, for example, be or comprise silicon dioxide, silicon glass, un-doped silicon glass, or the like and/or may have a thickness within a range of about 5,500 to 6,500 Angstroms. The lower dielectric layer 302 may, for example, be or comprise silicon carbide, silicon nitride, or the like and/or may have a thickness within a range of about 1,000 to 1,500 Angstroms. An etch stop layer 118 overlies the passivation structure 112. In some embodiments, the etch stop layer 118 may, for example, be or comprise aluminum oxide, another suitable oxide, or the like. The etch stop layer 118 has a thickness $t_{el}$, such that the thickness $t_{el}$ may, for example, be within a range of about 100 to 1,000 Angstroms.

In some embodiments, the bond pad 114 may, for example, be or comprise aluminum, copper, aluminum copper, tantalum nitride, or the like. In some embodiments, the bond pad 114 may have a thickness $t_{bp}$ defined between a bottom surface of the lower dielectric layer 302 and a bottom surface of the bump structure 120. The thickness $t_{bp}$ may, for example, be within a range of about 1,000 to 8,000 Angstroms. In further embodiments, the bond pad 114 may, for example, include a first conductive layer comprising a first material (e.g., aluminum copper), and a second conductive layer comprising a second material (e.g., tantalum nitride) different from the first material. The first conductive layer directly overlies the second conductive layer, for example, see the upper and lower bond pad layers 114a, 114b of FIG. 5B.

A buffer layer 116 is disposed between the etch stop layer 118 and an upper surface 114us of the bond pad 114. In some embodiments, the buffer layer 116 may, for example, be or comprise a nitride (e.g., titanium nitride, tantalum nitride, silicon nitride, or silicon oxynitride), or an oxide (e.g., titanium oxide, silicon dioxide, or silicon oxynitride), titanium, or the like and/or may have a thickness $t_{bl}$ within a range of about 100 to 1,000 Angstroms. In some embodiments, if the thickness $t_{bl}$ is 100 Angstroms or greater, then a wet etch process may be utilized during fabrication of the bump structure 120 to expose the upper surface 114us of the bond pad 114. In yet further embodiments, if the thickness $t_{bl}$ is 1,000 Angstroms or less, then the upper surface 114us of the bond pad 114 may be protected while performing a plasma etch (during fabrication of the bump structure 120) to remove a portion of the etch stop layer 118. In some embodiments, if the thickness $t_{bl}$ is greater than 1,000 Angstroms, then the buffer layer 116 may be prone to damage due to particle defects during a deposition process. This in turn may result in delamination between the buffer layer 116 and adjacent layers. By virtue of the thickness $t_{bl}$ and materials of the buffer layer 116, a re-deposition of conductive materials from the bond pad 114 to opposing sidewalls 120s1, 120s2 of the bump structure 120 is mitigated during fabrication of the bump structure 120. Further, the buffer layer 116 protecting the upper surface 114us of the bond pad 114 during the plasma etch process mitigates and/or eliminates corrosion of the upper surface 114us of the bond pad 114 (e.g., bond pad defect issues). This mitigates and/or omits utilization of a treatment process (e.g., an argon bombardment process) on the upper surface 114us of the bond pad 114, thereby reducing yield loss, time, and costs associated with fabricating the bond pad 114 and/or the bump structure 120. In some embodiments, a height of the curved sidewalls of the opposing sidewalls 120s1, 120s2 are equal to the thickness $t_{bl}$.

In some embodiments, the bump structure 120 may, for example, be or comprise nickel, gold, or the like and/or may have a height $h_{bs}$ within a range of about 3,000 to 10,000 Angstroms. The bump structure 120 has a first width $w_1$ defined between the vertical sidewalls of the opposing sidewalls 120s1, 120s2. In some embodiments, the first width $w_1$ is within a range of about 1 to 5 micrometers. The bump structure has a second width $w_2$ defined between the curved sidewalls of the opposing sidewalls 120s1, 120s2. In some embodiments, the second width $w_2$ is within a range of about 1.01 to 5.06 micrometers. In further embodiments, the second width $w_2$ is greater than the first width $w_1$.

In some embodiments, the bump structure 120 has a lateral distance di defined between the vertical sidewall of the opposing sidewalls 120s1, 120s2 and an outer point of the curved sidewall of the opposing sidewalls 120s1, 120s2. In some embodiments, the lateral distance di is within a range of about 50 to 300 Angstroms. In further embodiments, a value of the lateral distance di correlates to the thickness $t_{bl}$ of the buffer layer 116. For example, if the thickness $t_{bl}$ is relatively thin (e.g., approximately 100 Angstroms), then the lateral distance di may be relatively small (e.g., approximately 50 Angstroms). In another example, if the thickness $t_{bl}$ is relatively thick (e.g., approximately 1,000 Angstroms), then the lateral distance di may be relatively large (e.g., approximately 300 Angstroms).

Figure 4:
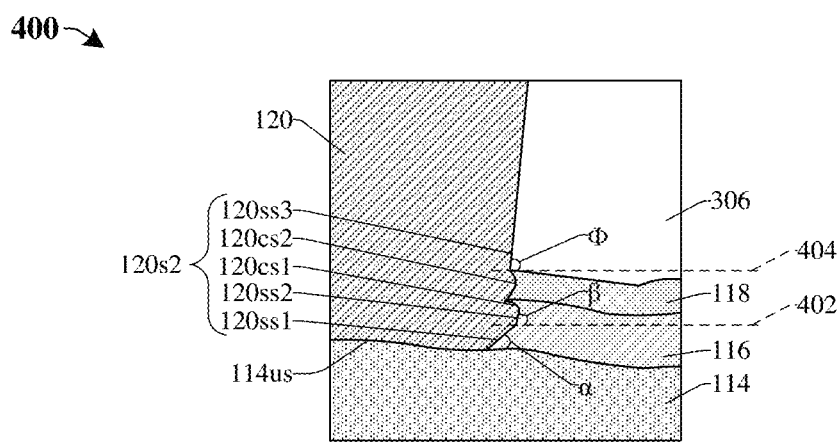
FIG. 4 illustrates a cross-sectional view of some embodiments of a close-up view of a section of the bump structure of FIG. 3.

Referring to FIG. 4, a cross-sectional view 400 of some embodiments of a close-up view of a section of the bump structure 120 of FIG. 3, as indicated by the dashed outline box in FIG. 3 is provided.

As illustrated in FIG. 4, the bump structure 120 conforms to an undercut profile of the buffer layer 116 and an undercut profile of the etch stop layer 118. A sidewall 120s2 of the bump structure 120 includes: a first slanted sidewall 120ss1, a second slanted sidewall 120ss2, a first curved sidewall 120cs1, a second curved sidewall 120cs2, and a third slanted sidewall 120ss3. The first slanted sidewall 120ss1 has a first angle α defined between the upper surface 114us of the bond pad 114 and the bump structure 120. In some embodiments, the first angle α is within a range of approximately 10 to 60 degrees. The second slanted sidewall 120ss2 has a second angle β defined between the bump structure 120 and a first horizontal line 402. In some embodiments, the second angle β is within a range of approximately 10 to 80 degrees. In further embodiments, the first angle α is less than the second angle β. The first curved sidewall 120cs1 is in direct contact with a curved undercut portion of the buffer layer 116. The second curved sidewall 120cs2 directly overlies the first curved sidewall 120cs1 and is in direct contact with an undercut portion of the etch stop layer 118. The third slanted sidewall 120ss3 has a third angle Φ defined between the bump structure 120 and a second horizontal line 404. In some embodiments, the third angle Φ is within a range of approximately 10 to 90 degrees. The aforementioned sidewalls of the sidewall 120s2 of the bump structure 120 may be defined by one or more etching processes utilized during fabrication of the bump structure 120.

Figure 5A:
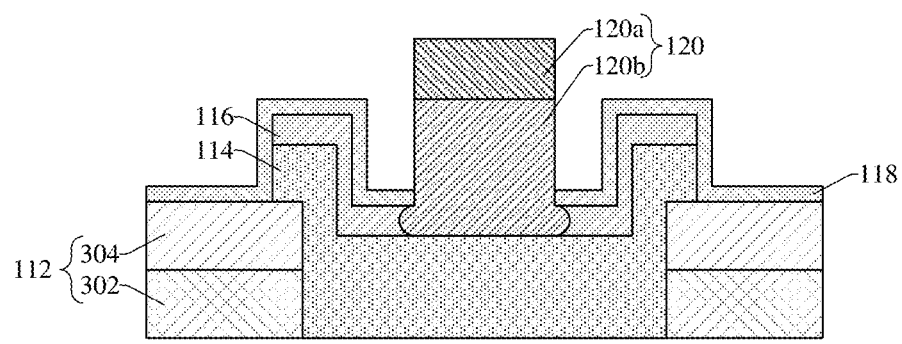
FIGS. 5A and 5B illustrates cross-sectional views of some alternative embodiments of the bump structure of FIG. 1.

Referring to FIG. 5A, a cross-sectional view 500a of alternative embodiments of the bump structure 120 of FIG. 3 is provided.

The bump structure 120 comprises an upper conductive structure 120a and a lower conductive structure 120b. In some embodiments, the upper conductive structure 120a comprises a first material and the lower conductive structure 120b comprises a second material different than the first material. For example, the first material of the upper conductive structure 120a may be or comprise gold and the second material of the lower conductive structure 120b may be or comprise nickel. Opposing sidewalls of the upper conductive structure 120a respectively comprise a continuous straight vertical sidewall. Opposing sidewalls of the lower conductive structure 120b respectively comprise a continuous straight vertical sidewall directly overlying a curved sidewall.

Figure 5B:
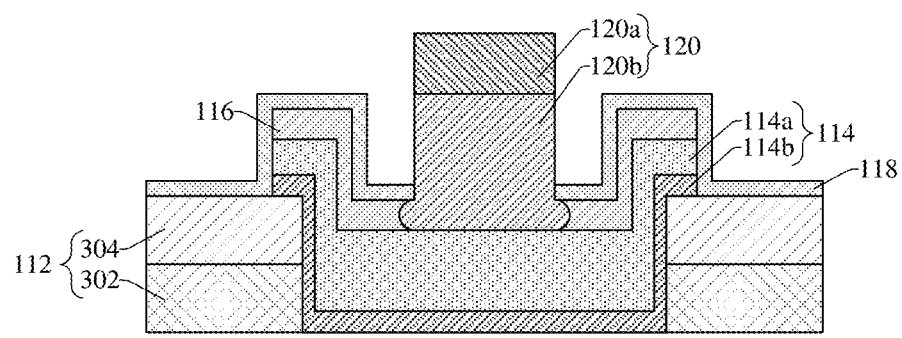

Referring to FIG. 5B, a cross-sectional view 500b of alternative embodiments of the bump structure 120 of FIG. 3 is provided.

The bond pad 114 includes an upper bond pad layer 114a and a lower bond pad layer 114b underling the upper bond pad layer 114a. The upper bond pad layer 114a comprises a first bond pad material and the lower bond pad layer 114b comprises a second bond pad material different than the first bond pad material. In some embodiments, the first bond pad material may, for example, be or comprise aluminum, copper, aluminum copper, or the like. In some embodiments the second bond pad material may, for example, be or comprise tantalum, a nitride, tantalum nitride, or the like. The upper bond pad layer 114a directly contacts the buffer layer 116 and the bump structure 120.

Figure 6:
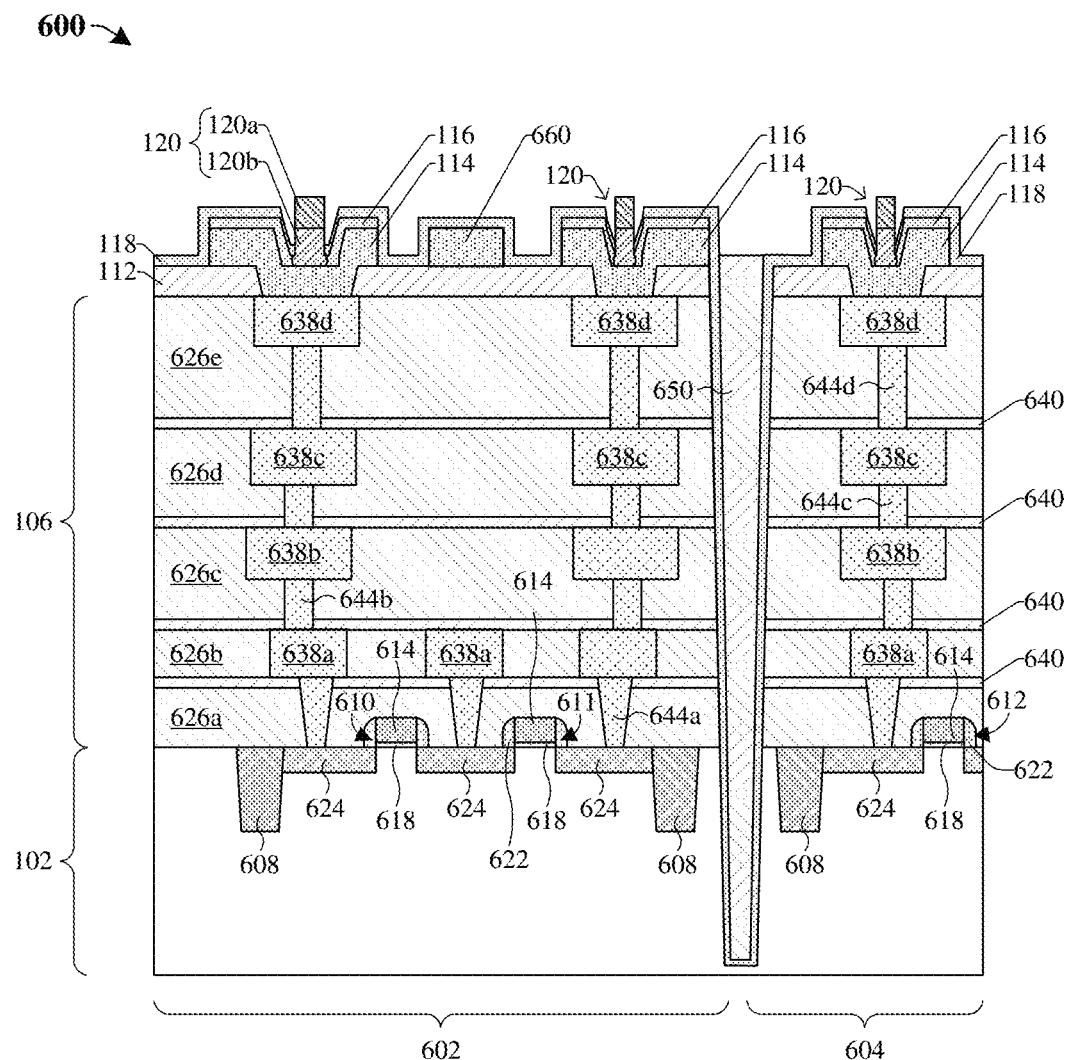
FIG. 6 illustrates a cross-sectional view of some embodiments of a complementary metal-oxide semiconductor (CMOS) chip having a plurality of semiconductor devices disposed over a substrate, an interconnect structure overlying the substrate, and bump structures overlying the interconnect structure.

Referring to FIG. 6, a cross-sectional view of a complementary metal-oxide semiconductor (CMOS) chip 600 including a plurality of bump structures 120 overlying an interconnect structure 106 is provided.

The CMOS chip 600 includes substrate 102. The substrate 102 may, for example, be a bulk substrate (e.g., a bulk silicon substrate) or a silicon-on-insulator (SOI) substrate. The illustrated embodiment depicts one or more shallow trench isolation (STI) regions 608 that may include a dielectric-filled trench within the substrate 102.

Transistors 610, 611 are disposed between the STI regions 608 in a first semiconductor device region 602. A transistor 612 is disposed adjacent to the STI region 608 in a second semiconductor device region 604. In some embodiments, the first semiconductor device region 602 may be a memory array region (comprising memory cells disposed in the interconnect structure 106) and the second semiconductor device region 604 may be a logic region. In further embodiments, the first semiconductor device region 602 is separated from the second semiconductor device region 604 by a deep trench isolation structure 650. The transistors 610, 611, 612 respectively include gate electrodes 614, gate dielectric layers 618, sidewall spacers 622, and source/drain regions 624. The source/drain regions 624 are disposed within the substrate 102 on either side of each gate electrode 614, and are doped to have a first conductivity type (e.g., n-type) which is opposite a second conductivity type (e.g., p-type) of a channel region under each gate dielectric layer 618. The gate electrodes 614 may, for example, respectively be doped polysilicon, or a metal, such as tungsten, a silicide, or combinations thereof. The gate dielectric layers 618 may, for example, each be or comprise an oxide, such as silicon dioxide, or a high-k dielectric material. As used herein, a high-k dielectric material is a dielectric material with a dielectric constant greater than 3.9. The sidewall spacers 622 may, for example be made of silicon nitride.

The interconnect structure 106 is arranged over the substrate 102 and includes a plurality of inter-metal dielectric (IMD) layers 626a-e, a plurality of conductive wire layers 638a-d, and a plurality of conductive vias 644a-d. The IMD layers 626a-e may, for example, respectively be made of a low-k dielectric material, such as un-doped silicate glass, or an oxide, such as silicon dioxide. As used herein, a low-k dielectric material is a dielectric material with a dielectric constant less than 3.9. The conductive wire layers 638a-d are formed within trenches and may be made of a metal such as copper, aluminum, or the like. Bottom conductive vias 644a extend from a bottom conductive wire layer 638a to the source/drain regions 624 and/or gate electrodes 614; and the conductive vias 644b-d extend between the conductive wire layers 638b-d. The conductive vias 644a-d extend through dielectric protection layers 640 (which can be made of dielectric material and/or can act as etch stop layers during manufacturing). The dielectric protection layers 640 may, for example, be made of a nitride (e.g., silicon nitride), a carbide (e.g., silicon carbide), an oxide (e.g., silicon oxynitride), or the like. The conductive vias 644a-d may, for example, each be made of a metal, such as copper, tungsten, or the like.

A passivation structure 112 overlies a topmost IMD layer 626e. Bond pads 114 extend from a top surface of the passivation structure 112 to an uppermost conductive wire layer 638d. A buffer layer 116 overlies each bond pad 114 and an etch stop layer 118 overlies the buffer layers 116. The etch stop layer 118 continuously extends from the passivation structure 112 to below a top surface of the substrate 102. The etch stop layer 118 cups an underside of the deep trench isolation structure 650. Bump structures 120 overlie each bond pad 114 such that the bump structures 120 are electrically coupled to the source/drain regions 624 of the transistors 610, 611, 612 by way of the interconnect structure 106. In some embodiments, the bump structures 120 are each configured as the bump structure 120 of FIG. 5A, in which each bump structure 120 has an upper conductive structure 120a and a lower conductive structure 120b. The bump structures 120 are configured to facilitate coupling the transistors 610, 611, 612 to another integrated chip (not shown). A conductive bonding structure 660 is laterally disposed between adjacent bump structures 120. The conductive bonding structure 660 is configured to facilitate bonding the bump structures 120 to the another integrated chip (not shown). In some embodiments, the conductive bonding structure 660 may, for example, be or comprise a same material as the bond pad 114.

FIGS. 7-18 illustrate cross-sectional views 700-1800 of some embodiments of a method of forming a bump structure overlying a bond pad. Although the cross-sectional views 700-1800 shown in FIGS. 7-18 are described with reference to a method, it will be appreciated that the structures shown in FIGS. 7-18 are not limited to the method but rather may stand alone separate of the method. Furthermore, although FIGS. 7-18 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 7:
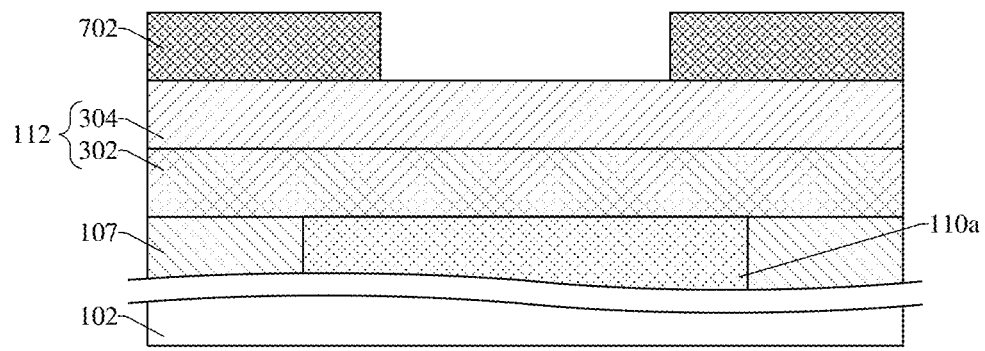
FIGS. 7-18 illustrate cross-sectional views of some embodiments of a method of forming a bump structure overlying a bond pad.

As shown in cross-sectional view 700 of FIG. 7, an interconnect dielectric structure 107 overlying a substrate 102 is provided. A topmost conductive wire 110a is disposed within the interconnect dielectric structure 107 and overlies the substrate 102. A passivation structure 112 is formed over the topmost conductive wire 110a. In some embodiments, the passivation structure 112 includes an upper dielectric layer 304, and a lower dielectric layer 302. A masking layer 702 is formed over the upper dielectric layer 304, such that a portion of the upper dielectric layer 304 is exposed. The upper dielectric layer 304 may, for example, be or comprise silicon dioxide, silicon glass, un-doped silicon glass, or the like formed to a thickness within a range of about 5,500 to 6,500 Angstroms. The lower dielectric layer 302 may, for example, be or comprise silicon carbide, silicon nitride, or the like formed to a thickness within a range of about 1,000 to 1,500 Angstroms. The upper dielectric layer 304 and/or the lower dielectric layer 302 may, for example, be formed by chemical vapor deposition (CVD), physical vapor deposition (PVD), atomic layer deposition (ALD), thermal oxidation, or another suitable deposition process. The masking layer 702 may, for example, be or comprise a hard mask layer, a photoresist, or the like.

Figure 8:
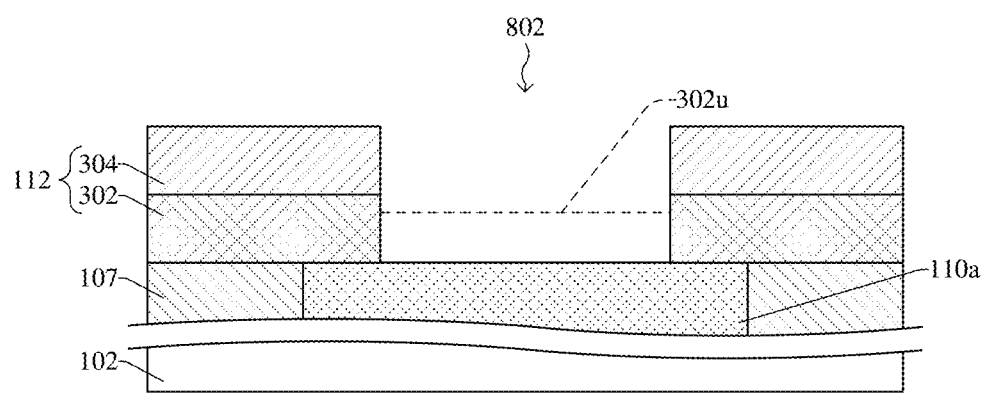

As shown in cross-sectional view 800 of FIG. 8, the passivation structure 112 is patterned according to the masking layer (702 of FIG. 7), thereby defining a bond pad opening 802 and exposing an upper surface of the topmost conductive wire 110a. In some embodiments, the patterning process includes exposing unmasked regions of the upper dielectric layer 304 and the lower dielectric layer 302 to one or more etchants. In yet further embodiments, after forming the bond pad opening 802, a removal process is performed to remove the masking layer (702 of FIG. 7).

In some embodiments, the patterning process includes a selective etch process that includes performing a first etch (e.g., a dry etch) on the upper dielectric layer 304 until an upper surface 302u of the lower dielectric layer 302 is exposed. In some embodiments, the first etch may over etch and remove a portion of the lower dielectric layer 302, such that the upper surface 302u of the lower dielectric layer 302 is disposed below a bottom surface of the upper dielectric layer 304. Further, after performing the first etch, a second etch (e.g., a wet etch) is performed on the lower dielectric layer 302 until an upper surface of the topmost conductive wire 110a is exposed.

Figure 9:
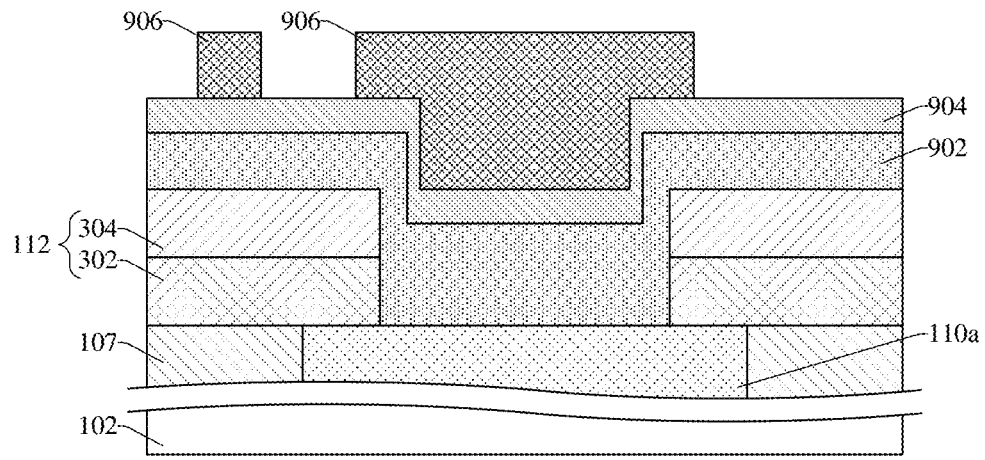

As shown in cross-sectional view 900 of FIG. 9, a conductive layer 902 and a metal protection layer 904 are formed over the passivation structure 112 and the topmost conductive wire 110a. The conductive layer 902 and the metal protection layer 904 fill the bond pad opening (802 of FIG. 8). A masking layer 906 is formed over the metal protection layer 904. In some embodiments, the masking layer 906 may, for example, be a photoresist, a hard mask layer, or the like. The conductive layer 902 may, for example, be or comprise aluminum, copper, aluminum copper, tantalum nitride, or the like formed to a thickness within a range of about 1,000 to 8,000 Angstroms. In further embodiments, the conductive layer 902 may, for example include a first conductive layer comprising a first material (e.g., aluminum copper) and a second conductive layer comprising a second material (e.g., tantalum nitride) different from the first material (not shown). In some embodiments, the metal protection layer 904 may, for example, be or comprise silicon oxynitride, silicon carbide, silicon nitride, or the like formed to a thickness within a range of about 250 to 350 Angstroms.

Figure 10:
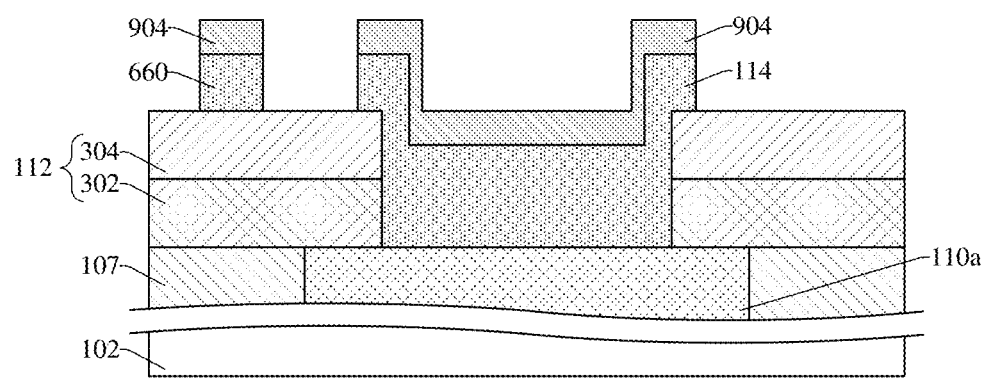

As shown in cross-sectional view 1000 of FIG. 10, the conductive layer (902 of FIG. 9) and the metal protection layer 904 are patterned according to the masking layer (906 of FIG. 9), thereby defining a bond pad 114 and a conductive bonding structure 660. The conductive bonding structure 660 is laterally offset the bond pad 114 by a non-zero distance. In some embodiments, after forming the bond pad 114 and the conductive bonding structure 660, a removal process is performed to remove the masking layer (906 of FIG. 9).

Figure 11:
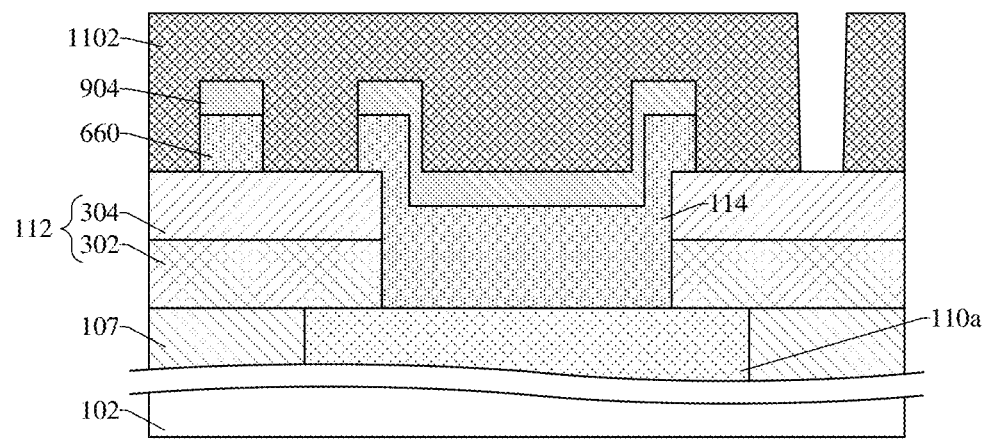

As shown in cross-sectional view 1100 of FIG. 11, a masking layer 1102 is formed over the passivation structure 112 and the bond pad 114. The masking layer 1102 may, for example, be a photoresist, a hard mask, or the like.

Figure 12:
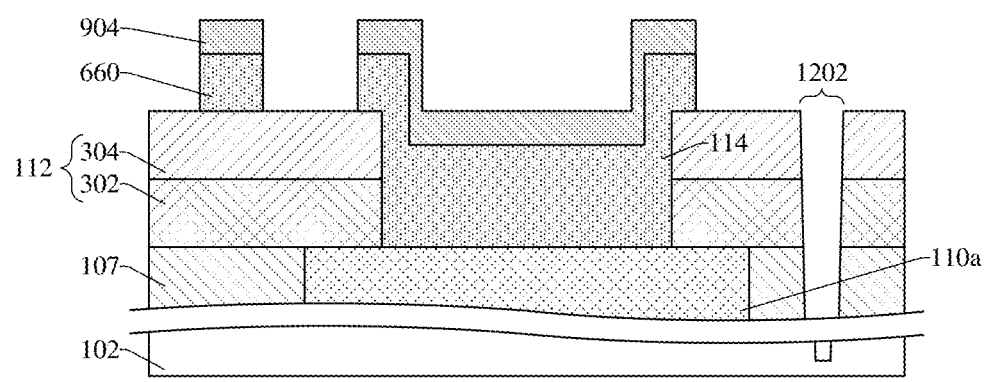

As shown in cross-sectional view 1200 of FIG. 12, the passivation structure 112, interconnect dielectric structure 107, and the substrate 102 are patterned according to the masking layer (1102 of FIG. 11), thereby defining a deep trench isolation structure opening 1202. In some embodiments, the patterning process includes, for example, performing a high power plasma etching process, such that dielectric materials under unmasked regions of the upper dielectric layer 304 and disposed between the passivation structure 112 and the substrate 102 are removed. In some embodiments, the deep trench isolation structure opening 1202 is defined between a memory array region and a logic region of an integrated chip (not shown). In some embodiments, after performing the patterning process, a removal process is performed to remove the masking layer (1102 of FIG. 11).

Figure 13:
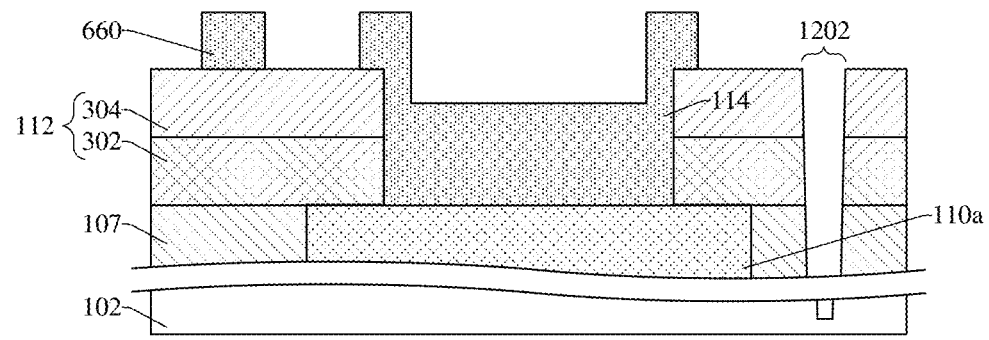

As shown in cross-sectional view 1300 of FIG. 13, the metal protection layer (904 of FIG. 12) is removed, thereby exposing an upper surface of the bond pad 114 and an upper surface of the conductive bonding structure 660.

Figure 14:
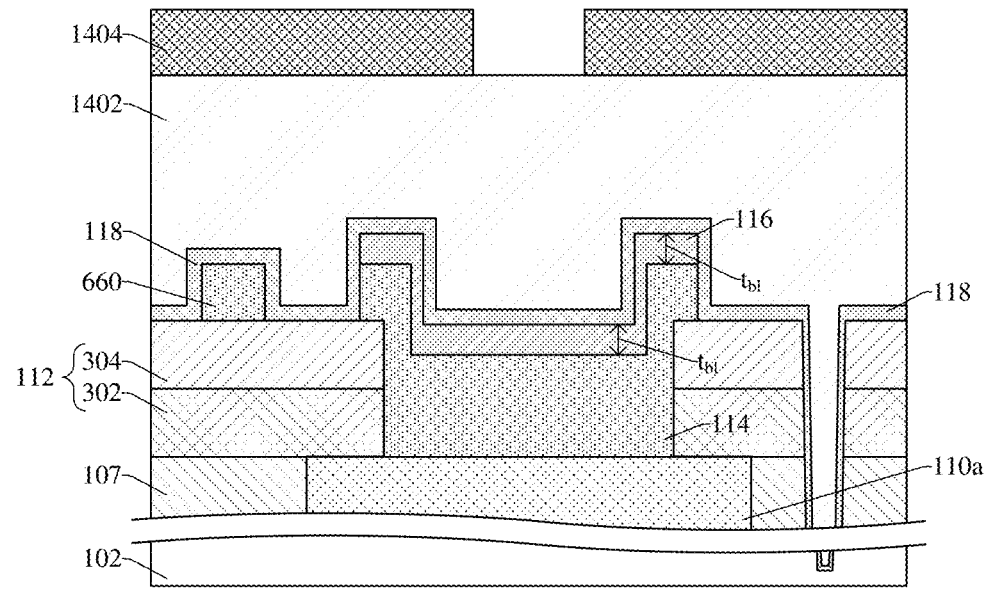

As shown in cross-sectional view 1400 of FIG. 14, a buffer layer 116 is formed over the upper surface of the bond pad 114. In some embodiments, the buffer layer 116 may, for example, be or comprise a nitride (e.g., titanium nitride, tantalum nitride, silicon nitride, or silicon oxynitride), or an oxide (e.g., titanium oxide, silicon dioxide, or silicon oxynitride), titanium, or the like and/or may be formed with a thickness $t_{bl}$ within a range of about 100 to 1,000 Angstroms. In some embodiments, the buffer layer 116 may be deposited and/or grown by CVD, PVD, ALD, thermal oxidation, or another suitable deposition process. An etch stop layer 118 is formed over the buffer layer 116, the passivation structure 112, and the substrate 102. In some embodiments, the etch stop layer 118 may, for example, be or comprise aluminum oxide, silicon oxynitride, another suitable oxide, or the like formed to a thickness within a range of about 100 to 1,000 Angstroms. In some embodiments, the etch stop layer 118 and the buffer layer 116 have a same thickness. The etch stop layer 118 lines the deep trench isolation structure opening (1202 of FIG. 13), such that the etch stop layer 118 continuously extends from above the bond pad 114 to a trench of the substrate 102. In some embodiments, the etch stop layer 118 may be deposited and/or grown by CVD, PVD, ALD, thermal oxidation, or another suitable deposition process.

Further, as shown in cross-sectional view 1400 of FIG. 14, an upper dielectric structure 1402 is formed over the etch stop layer 118. The upper dielectric structure 1402 may, for example, be or comprise gold oxide, silicon dioxide, another oxide, or the like. The upper dielectric structure 1402 fills the deep trench isolation structure opening (1202 of FIG. 13). In some embodiments, the upper dielectric structure 1402 may be deposited and/or grown by CVD, PVD, ALD, thermal oxidation, or another suitable deposition process. A masking layer 1404 is formed over the upper dielectric structure 1402. In some embodiments, the masking layer 1404 may, for example, be a hard mask, a photoresist, or the like. The masking layer 1404 defines an opening above the bond pad 114.

Figure 15:
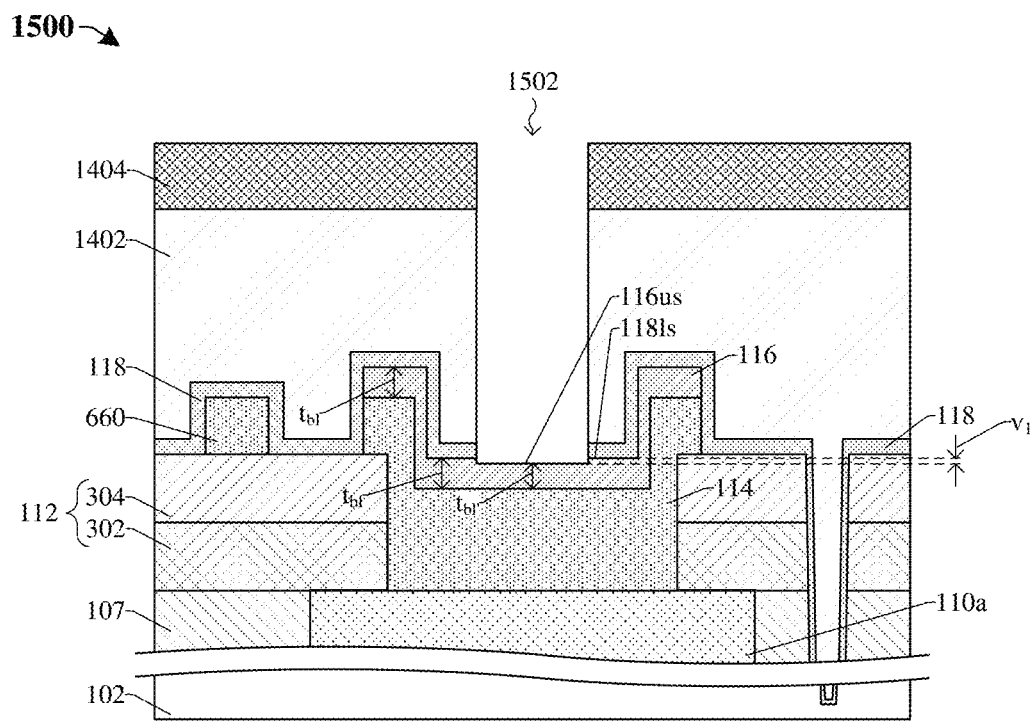

As shown in cross-sectional view 1500 of FIG. 15, the structure of FIG. 14 is patterned according to the masking layer 1404, thereby defining a bump structure opening 1502 over the buffer layer 116. The patterning process may include performing a dry etch process (e.g., a plasma etch process) on unmasked portions of the upper dielectric structure 1402, and unmasked portions of the etch stop layer 118. In some embodiments, the dry etch process includes exposing the upper dielectric structure 1402 and the etch stop layer 118 to one or more etchants, such as, for example, tetrafluoromethane ($CF_4$), trifluoromethane ($CHF_3$), difluoromethane ($CH_2F_2$), sulfur hexafluoride ($SF_6$), hexafluorocyclobutene ($C_4F_6$), octafluorocyclopentene ($C_5F_8$), octafluorocyclobutane ($C_4F_8$), or the like. In some embodiments, the dry etch process may over etch and remove a portion of the buffer layer 116, such that an upper surface 116us of the buffer layer 116 is vertically offset a lower surface 118ls of the etch stop layer 118 by a non-zero vertical distance vi. Thus, the dry etch process may reduce the thickness $t_{bl}$ of the buffer layer 116 directly over an upper surface of the bond pad 114 to a reduced thickness $t_{bl}$. The reduced thickness for may, for example, be within a range of about 50 to 900 Angstroms. In further embodiments, sidewalls of the upper dielectric structure 1402 and sidewalls of the etch stop layer 118 are slanted (not shown).

In some embodiments, by virtue of the thickness $t_{bl}$ and the material of the buffer layer 116, the upper surface of the bond pad 114 is protected from the dry etch process. For example, if the thickness $t_{bl}$ is 100 Angstroms or greater, then at least a portion of the buffer layer 116 will remain over the upper surface of the bond pad 114 after removing a portion of the etch stop layer 118 during the dry etch process. This, in part, prevents re-deposition of conductive materials (e.g., aluminum) from the bond pad 114 to sidewalls of the etch stop layer 118 and upper dielectric structure 1402, while reducing materials utilized to form the bump structure opening 1502. This, in part, prevents re-deposition of conductive materials (e.g., aluminum) from the bond pad 114 to sidewalls of the etch stop layer 118 and upper dielectric structure 1402, while facilitating the use of a high powered etch (i.e., reducing fabrication time) during the dry etch process. Further, the buffer layer 116 protecting the upper surface of the bond pad 114 during the dry etch process mitigates and/or eliminates utilization of a treatment process (e.g., utilizing argon vapor) on the upper surface of the bond pad 114. This, in part, reduces time, costs, and a yield loss associated with fabricating the bond pad 114 and an overlying bump structure (e.g., 120 of FIG. 17).

Figure 16:
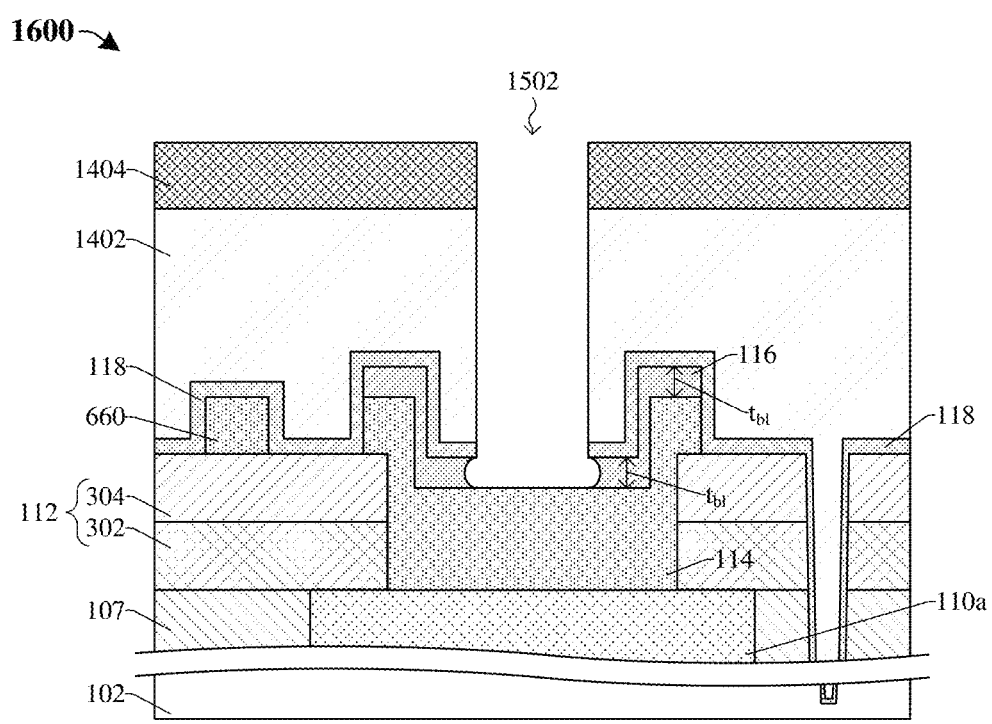

As shown in cross-sectional view 1600 of FIG. 16, an etching process is performed on the structure of FIG. 15, thereby further expanding the bump structure opening 1502 and exposing an upper surface of the bond pad 114. After the etching process, the buffer layer 116 comprises curved sidewall and/or slanted sidewall (not shown) directly overlying the upper surface of the bond pad 114. The etching process may include a wet etch process utilizing one or more etchants. In some embodiments, the one or more etchants may, for example, be or comprise hydrogen peroxide ($H_2O_2$). The wet etch process may, for example, reach a maximum temperature of 70 degrees Celsius. In some embodiments, the etching process is selective to the buffer layer 116, meaning that a material of the buffer layer 116 is etched at a first removal rate by the one or more etchants, and a material of the etch stop layer 118, a material of the upper dielectric structure 1402, and/or a material of the bond pad 114 is etched at a second removal rate by the one or more etchants, the second removal rate being much less than the first removal rate. In some embodiments, during the etching process that exposes the upper surface of the bond pad 114, conductive materials (e.g., aluminum) from the bond pad 114 are not re-deposited onto the sidewalls of the buffer layer 116, sidewalls of the etch stop layer 118, and/or sidewalls of the upper dielectric structure 1402 that define the bump structure opening 1502. In further embodiments, after performing the etching process, a removal process is performed to remove the masking layer 1404 (not shown).

Figure 17:
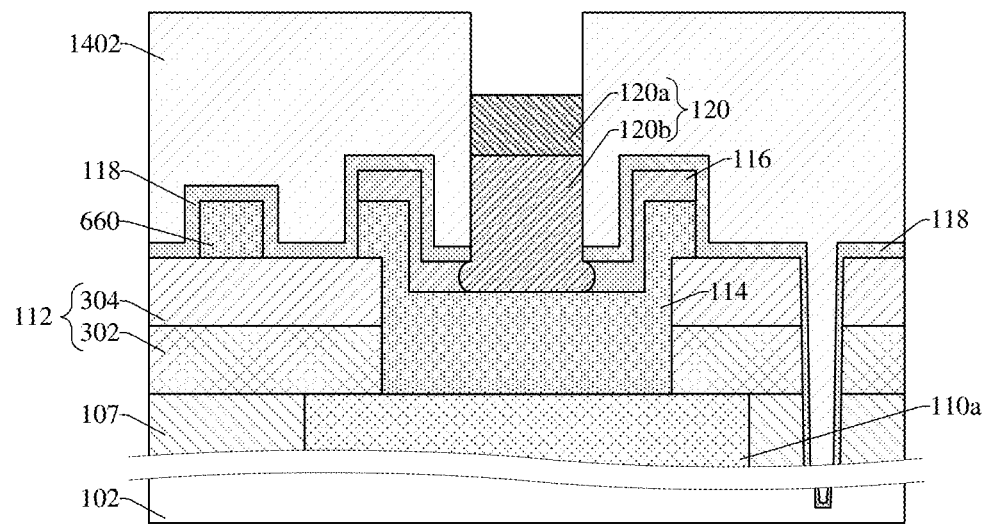

As shown in cross-sectional view 1700 of FIG. 17, a bump structure 120 is formed in the bump structure opening (1502 of FIG. 16). In some embodiments, a process for forming the bump structure 120 may include: forming a lower conductive structure 120b directly over the bond pad 114, such that the lower conductive structure 120b conforms to and/or directly contacts the curved sidewall and/or slanted sidewall (not shown) of the buffer layer 116; and subsequently forming an upper conductive structure 120a over the lower conductive structure 120b. In further embodiments, the upper conductive structure 120a comprises a first material (e.g., gold) different than a second material (e.g., nickel) of the lower conductive structure 120b.

Figure 18:
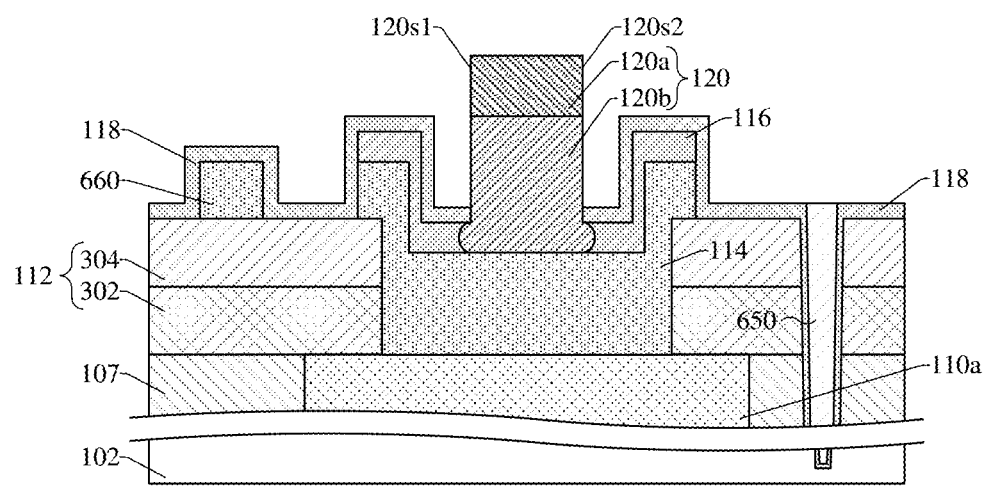

As shown in cross-sectional view 1800 of FIG. 18, an etching process is performed to remove the upper dielectric structure (1402 of FIG. 17). In some embodiments, the etching process includes performing a vapor etch and/or a wet etch that exposes the structure of FIG. 17 to one or more etchants. The one or more etchants may, for example, be or comprise hydrofluoric acid. In yet further embodiments, after performing the etching process with the one or more etchants (e.g., hydrofluoric acid), conductive materials along opposing sidewalls 120s1, 120s2 of the bump structure 120 do not peel off and/or electrically short adjacent conductive structures (e.g., the conductive bonding structure 660) together. Thus, by virtue of the buffer layer 116 protecting the upper surface of the bond pad 114 and use of a wet etch process to expose the upper surface of the bond pad 114, peeling of conductive materials from the opposing sidewalls 120s1, 120s2 is mitigated and/or does not occur.

Figure 19:
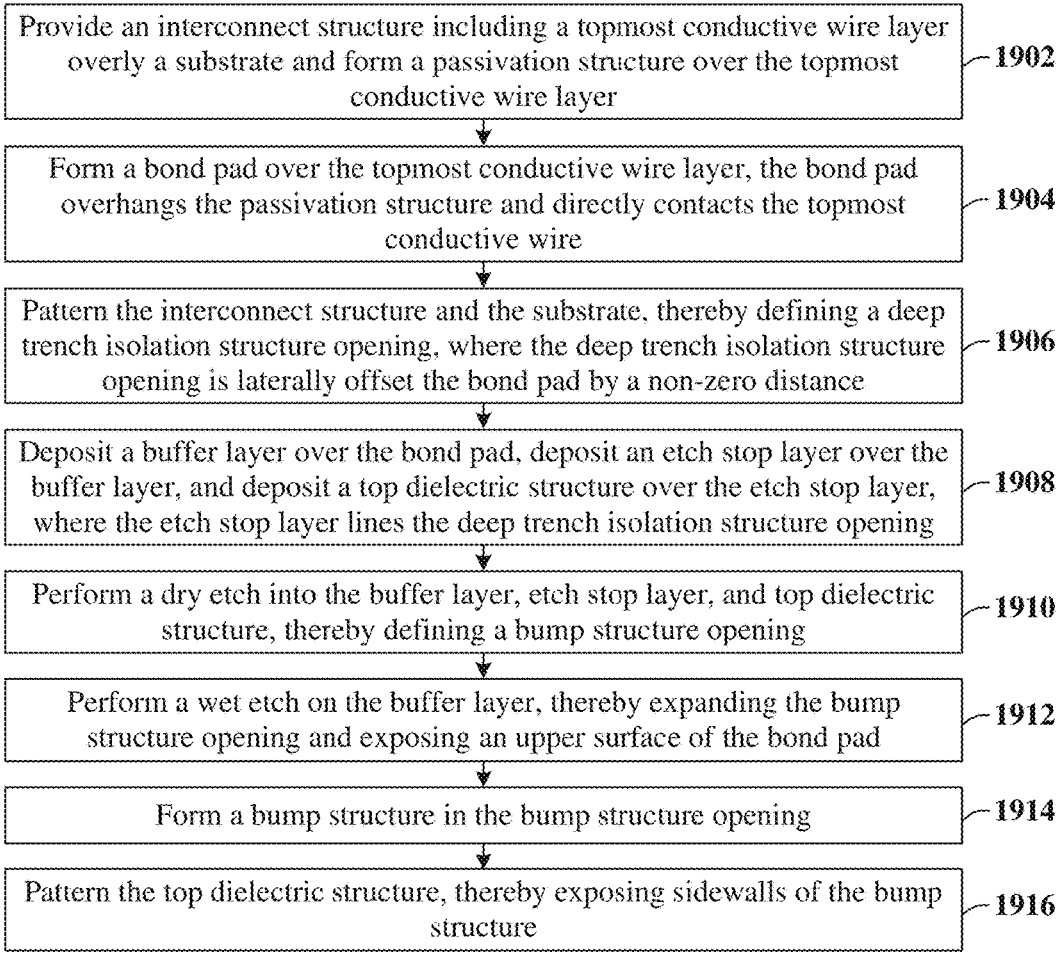
FIG. 19 illustrates a methodology in flowchart format that illustrates some embodiments of a method of forming a bump structure overlying a bond pad.

FIG. 19 illustrates a method 1900 of forming a bump structure overlying a bond pad. Although the method 1900 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1902, an interconnect structure is provided that includes a topmost conductive wire layer overlying a substrate and a passivation structure is formed over the topmost conductive wire layer. FIG. 7 illustrates a cross-sectional view 700 corresponding to some embodiments of act 1902.

At act 1904, a bond pad is formed over the topmost conductive wire layer. The bond pad overhangs the passivation structure and directly contacts the topmost conductive wire. FIGS. 8-10 illustrate cross-sectional views 800-1000 corresponding to some embodiments of act 1904.

At act 1906, the interconnect structure and the substrate are patterned, thereby defining a deep trench isolation structure opening. The deep trench isolation structure opening is laterally offset the bond pad by a non-zero distance. FIGS. 11 and 12 illustrate cross-sectional views 1100 and 1200 corresponding to some embodiments of act 1906.

At act 1908, a buffer layer is deposited over the bond pad, an etch stop layer is deposited over the buffer layer, and an upper dielectric structure is deposited over the etch stop layer. The etch stop layer lines the deep trench isolation structure opening. FIG. 14 illustrates a cross-sectional view 1400 corresponding to some embodiments of act 1908.

At act 1910, a dry etch is performed into the buffer layer, etch stop layer, and upper dielectric structure, thereby defining a bump structure opening. FIG. 15 illustrates a cross-sectional view 1500 corresponding to some embodiments of act 1910.

At act 1912, a wet etch is performed on the buffer layer, thereby expanding the bump structure opening and exposing an upper surface of the bond pad. FIG. 16 illustrates a cross-sectional view 1600 corresponding to some embodiments of act 1912.

At act 1914, a bump structure is formed in the bump structure opening. FIG. 17 illustrates a cross-sectional view 1700 corresponding to some embodiments of act 1914.

At act 1916, the upper dielectric structure is patterned, thereby exposing sidewalls of the bump structure. FIG. 18 illustrates a cross-sectional view 1800 corresponding to some embodiments of act 1916.

Accordingly, in some embodiments, the present disclosure relates to a semiconductor structure including a bond pad overlying a conductive wire. The bond pad cups an underside surface of a buffer layer and a bump structure extends through the buffer layer to contact the bond pad. A sidewall of the bump structure includes a vertical sidewall segment overlying a curved sidewall segment.

In some embodiments, the present application provides a semiconductor device structure, including a bond pad disposed over a semiconductor substrate; an etch stop layer overlying the bond pad; a buffer layer disposed over the bond pad and separating the etch stop layer and the bond pad; and a bump structure including a base portion contacting an upper surface of the bond pad and an upper portion extending through the etch stop layer and the buffer layer, wherein the base portion of the bump structure has a first width or diameter and the upper portion of the bump structure has a second width or diameter, the first width or diameter being greater than the second width or diameter.

In some embodiments, the present application provides a semiconductor device structure, including an interconnect structure overlying a substrate, the interconnect structure includes a topmost conductive wire; a passivation structure overlying the interconnect structure; a bond pad overlying the topmost conductive wire, wherein the bond pad extends through the passivation structure and directly contacts a top surface of the topmost conductive wire, wherein the bond pad has an upper surface vertically below a top surface of the bond pad, and wherein the upper surface of the bond pad is vertically below a top surface of the passivation structure; an etch stop layer overlying the bond pad and the passivation structure; a buffer layer disposed between the etch stop layer and the bond pad, wherein the bond pad continuously extends along and cups an underside of the buffer layer; and a bump structure including a base portion contacting the upper surface of the bond pad and disposed within the buffer layer and an upper portion extending upwardly from the base portion and extending through the etch stop layer and the buffer layer, wherein the base portion has a first width defined within the buffer layer and the upper portion has a second width defined above the top surface of the buffer layer, and wherein the first width is greater than the second width.

In some embodiments, the present application provides a method for forming a semiconductor device structure, the method including forming a passivation structure over a conductive wire; forming a bond pad over the conductive wire, wherein the bond pad overhangs the passivation structure; depositing a buffer layer over the bond pad; depositing an etch stop layer over the buffer layer and the passivation structure; depositing an upper dielectric structure over the etch stop layer; performing a dry etch process into the buffer layer, the etch stop layer, and the upper dielectric structure, the dry etch process defines a bump structure opening overlying an upper surface of the bond pad, wherein a portion of the buffer layer overlies the upper surface of the bond pad after the dry etch process; performing a wet etch process on the buffer layer, the wet etch process removes the portion of the buffer layer overlying the upper surface of the bond pad, wherein the wet etch process expands the bump structure opening and exposes an upper surface of the bond pad; and forming a bump structure in the bump structure opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   an upper conductive structure overlying a substrate;
   a buffer layer disposed along an upper surface of the upper conductive structure;
   and
   a bond bump disposed on the upper surface of the upper conductive structure, wherein the bond bump comprises a sidewall having a straight sidewall segment overlying a curved sidewall segment, wherein the straight sidewall segment abuts the curved sidewall segment.

2. The semiconductor structure of claim 1, wherein a height of the straight sidewall segment is greater than a height of the curved sidewall segment.

3. The semiconductor structure of claim 1, wherein the buffer layer comprises a first conductive material.

4. The semiconductor structure of claim 3, wherein the bond bump comprises a second conductive material different from the first conductive material.

5. The semiconductor structure of claim 1, wherein a height of the curved sidewall segment is equal to a thickness of the buffer layer along the upper surface of the upper conductive structure.

6. The semiconductor structure of claim 1, further comprising:

an interconnect structure disposed between the substrate and the upper conductive structure, wherein the interconnect structure comprises a top conductive wire, and wherein the upper conductive structure is disposed along the top conductive wire.

7. The semiconductor structure of claim 1, wherein the upper conductive structure comprises a top surface vertically above the upper surface of the upper conductive structure, wherein the curved sidewall segment is disposed below the top surface of the upper conductive structure.

8. The semiconductor structure of claim 1, wherein the bond bump is a single structure continuously extending from the upper surface of the upper conductive structure to a point above the buffer layer.

9. An integrated chip comprising:
a bond pad overlying a substrate;
a conductive layer disposed along the bond pad; and
a bump structure overlying the bond pad and extending through the conductive layer, wherein the bump structure comprises a protrusion that abuts a sidewall of the conductive layer.

10. The integrated chip of claim 9, wherein the bump structure comprises nickel and/or gold and the conductive layer comprises titanium and/or titanium nitride.

11. The integrated chip of claim 9, further comprising:
an etch stop layer overlying the conductive layer, wherein the etch stop layer is disposed vertically above the protrusion of the bump structure.

12. The integrated chip of claim 11, wherein a height of the protrusion is greater than a thickness of the etch stop layer.

13. The integrated chip of claim 9, wherein outer sidewalls of the conductive layer are aligned with outer sidewalls of the bond pad.

14. The integrated chip of claim 9, wherein a width of the bump structure increases from a top surface of the bump structure in a direction towards the substrate.

15. The integrated chip of claim 9, wherein the conductive layer continuously extends from the protrusion of the bump structure, along a sidewall of the bond pad, to a top surface of the bond pad.

16. A method for forming a semiconductor device structure, comprising:
forming a bond pad over a substrate;
depositing a buffer layer over the bond pad;
depositing an upper dielectric layer over the buffer layer;
performing a first etch process on the upper dielectric layer to form an opening over the bond pad;
performing a second etch process on the buffer layer to expand the opening and expose an upper surface of the bond pad, wherein the first etch process is different from the second etch process; and
forming a bond bump in the opening.

17. The method of claim 16, wherein the second etch process comprises a wet etch process.

18. The method of claim 17, wherein the first etch process comprises a dry etch process.

19. The method of claim 16, wherein the first etch process reduces a thickness of the buffer layer.

20. The method of claim 16, wherein the second etch process defines a curved inner sidewall in the buffer layer.

* * * * *